US011347251B1

(12) United States Patent
Kwon

(10) Patent No.: US 11,347,251 B1
(45) Date of Patent: May 31, 2022

(54) INTERNAL VOLTAGE GENERATION CIRCUIT AND SEMICONDUCTOR DEVICE INCLUDING THE SAME

(71) Applicant: SK hynix Inc., Gyeonggi-do (KR)

(72) Inventor: Chan Keun Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/343,024

(22) Filed: Jun. 9, 2021

(30) Foreign Application Priority Data

Jan. 11, 2021 (KR) .................. 10-2021-0003288

(51) Int. Cl.
G05F 1/10 (2006.01)
G05F 1/575 (2006.01)
G11C 5/14 (2006.01)

(52) U.S. Cl.
CPC .............. *G05F 1/575* (2013.01); *G11C 5/147* (2013.01)

(58) Field of Classification Search
None
See application file for complete search history.

(56) References Cited

U.S. PATENT DOCUMENTS

| | | | | |
|---|---|---|---|---|
| 6,114,843 A * | 9/2000 | Olah | ................. | G05F 1/465 323/280 |
| 7,157,892 B1 * | 1/2007 | Ritter | ................. | G05F 1/468 323/284 |
| 7,688,667 B2 * | 3/2010 | Cha | ................. | G11C 5/14 365/226 |
| 8,786,358 B2 * | 7/2014 | Endo | ................. | G05F 3/245 327/539 |
| 10,599,170 B2 * | 3/2020 | Jeong | ................. | G05F 1/10 |
| 2009/0027958 A1 * | 1/2009 | Cha | ................. | G11C 5/14 365/185.2 |
| 2011/0227636 A1 * | 9/2011 | Endo | ................. | G05F 3/30 327/541 |

FOREIGN PATENT DOCUMENTS

| KR | 10-2015-0134106 | 12/2015 |
|---|---|---|
| KR | 10-2019-0130873 | 11/2019 |

\* cited by examiner

*Primary Examiner* — Thomas J. Hiltunen
(74) *Attorney, Agent, or Firm* — IP & T Group LLP

(57) ABSTRACT

An internal voltage generation circuit comprising: a first voltage generator buffers a first reference voltage from a first to a second time point and integrates the first reference voltage after the second time point to generate a first initial voltage, a divider outputs a second initial voltage by dividing the first initial voltage from the first to the second time point and to outputs the first initial voltage as the second initial voltage after the second time point, a selector selects and output the second initial voltage or a second reference voltage based on a comparison of level of a feedback voltage and the second reference voltage, and a second voltage generator generates an internal voltage depending on a result of comparing levels of an output voltage of the selector and the feedback voltage, and to generates the feedback voltage by dividing the internal voltage.

20 Claims, 8 Drawing Sheets

INTERNAL VOLTAGE GENERATION CIRCUIT AND SEMICONDUCTOR DEVICE INCLUDING THE SAME

CROSS-REFERENCE TO RELATED APPLICATION

This application claims priority under 35 U.S.C. § 119 to Korean Patent Application No. 10-2021-0003288, filed on Jan. 11, 2021, which is incorporated herein by reference in its entirety.

BACKGROUND

1. Field

One or more embodiments described herein relate to an internal voltage generation circuit and a semiconductor device including the same.

2. Discussion of the Related Art

Memory devices may be classified as one of two types: volatile memory devices and nonvolatile memory devices. In a volatile memory device, data is lost when power is interrupted. Examples of a volatile memory device include static RAM (SRAM), dynamic RAM (DRAM), and synchronous DRAM (SDRAM). In a nonvolatile memory device, data is stored even when power is interrupted. Examples of nonvolatile memory devices include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Examples of flash memory include a NOR-type and NAND-type memory.

Semiconductor memory devices may operate based on an internal voltage derived from a power voltage supplied from an external source. When the power voltage is supplied, the memory device may be said to "power-up." In many cases, the power voltage is not in a completely stable state. Therefore, during a power-up operation, it may be difficult for the memory device to determine whether signals and/or data are at logically high or logically low states.

In many memory devices, an initialization operation may be performed when the power voltage is first applied from an external source during power-up. Initialization may be performed using a power-up reset circuit, which prevents operation of the memory device when the external power voltage is unstable. The power-up reset circuit may also initialize the memory device. One type of power-up reset circuit detects when the external power voltage rises over a preset voltage level (e.g., when power of the memory device is turned on) and then generates a power-up reset signal. In these memory devices, all circuits of the memory device are initialized by the power-up reset signal.

SUMMARY

One or more embodiments described herein provide an internal voltage generation circuit capable of suppressing generation of a peak current during an internal voltage generation operation.

One or more embodiments further provide a semiconductor device including such an internal voltage generation circuit.

In an embodiment, an internal voltage generator, may include: a first voltage generator configured to generate a first initial voltage by buffering a first reference voltage input from a first time point to a second time point and to generate the first initial voltage by integrating a difference between a predetermined reference voltage and the first reference voltage input after the second time point, wherein the first time point is after a power-up time point and the second time point is after the first time point; a divider configured to output a second initial voltage by dividing a potential level of the first initial voltage at a first preset ratio from the first time point to the second time point, and to output the first initial voltage as the second initial voltage after the second time point; a selector configured to select and output the second initial voltage or a second reference voltage based on a comparison of a potential level of a feedback voltage and a potential level of the second reference voltage; and a second voltage generator configured to generate an internal voltage by receiving or blocking an external power voltage depending on a result of comparing potential levels of an output voltage of the selector and the feedback voltage, and to generate the feedback voltage by dividing the internal voltage at a second preset ratio.

In an embodiment, an internal voltage generator, may include: a first voltage generator configured to generate a first initial voltage by buffering a first reference voltage input from a first time point to a second time point and to generate the first initial voltage by integrating a difference between a predetermined reference voltage and the first reference voltage input after the second time point, wherein the first time point is after a power-up time point and the second time point is after the first time point; an enable signal generator configured to generate first to third enable signals in response to a power-up reset signal, activate the first enable signal at the first time point at which a potential level of an external power voltage rises over a preset level, activate the second enable signal at the second time point later by a preset delay amount than the first enable signal, and generate the third enable signal which maintains an activated state between the first time point and the second time point; a control signal generator configured to generate, in response to the first and second enable signals, a plurality of control signals activated in a predetermined order in each of a plurality of periods; a divider configured to output a second initial voltage by dividing a potential level of the first initial voltage at a first preset ratio that is changed based on the plurality of control signals during an activation period of the third enable signal, and to output the first initial voltage as the second initial voltage during a deactivation period of the third enable signal; and a second voltage generator configured to generate an internal voltage by receiving or blocking the external power voltage depending on a result of comparing potential levels of a feedback voltage and one of the second initial voltage and a second reference voltage, and to generate the feedback voltage by dividing the internal voltage at a second preset ratio.

In an embodiment, a semiconductor device, may include: a power-up reset circuit configured to detect a potential level of an external power voltage, and to generate a power-up reset signal which transitions at a first time point at which a potential level of the external power voltage rises over a preset level; a reference voltage generator configured to receive the external power voltage, and generate first and second reference voltages; and an internal voltage generator configured to: start to operate in response to the power-up reset signal, output a second initial voltage by dividing, at a first preset ratio, a potential level of a first initial voltage that is generated by buffering the first reference voltage from the first time point to a second time point later than the first time point, output, after the second time point, the first initial voltage having a potential level that rises with a constant slope, as the second initial voltage by integrating a difference between the first reference voltage and a ground voltage, generate an internal voltage by receiving or blocking the external power voltage depending on a result of comparing potential levels of a feedback voltage and one of the second initial voltage and the second reference voltage, and generate the feedback voltage by dividing the internal voltage at a second preset ratio.

In the present technology, by operating a voltage generation circuit using a voltage rising with a constant slope during an initial operation of generating an internal voltage, it is possible to suppress the generation of a peak current by the voltage generation circuit.

In addition, in the present technology, in order to prevent the occurrence of a phenomenon in which a current consumption amount of an external power voltage increases due to an abrupt increase in the potential level of the internal voltage during the initial operation of generating the internal voltage, a voltage divider circuit, which operates only in a predetermined partial period during the initial operation of generating the internal voltage, is included, whereby it is possible to stabilize the operation of the voltage generation circuit.

DETAILED DESCRIPTION

Figure 1:
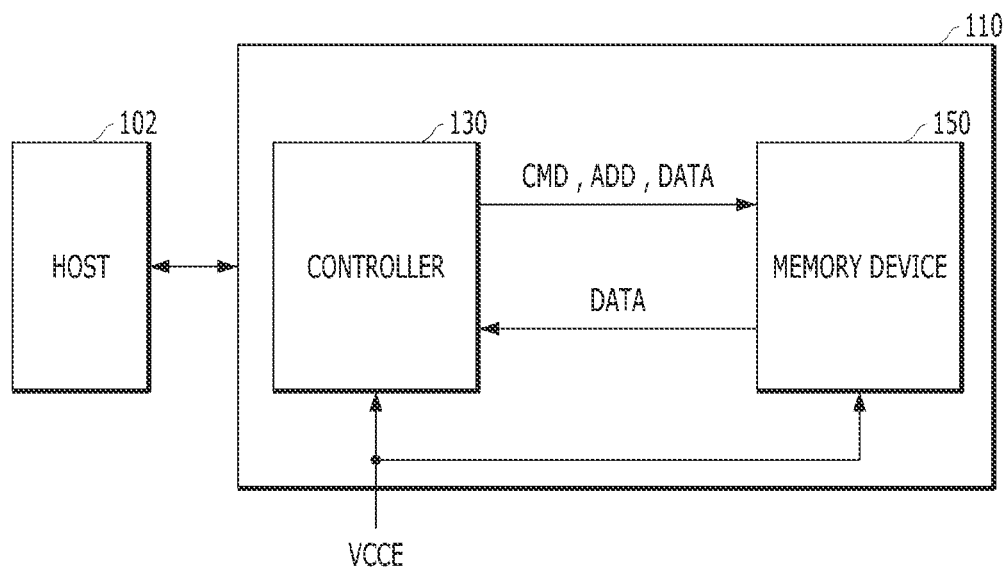
FIG. 1 illustrates an embodiment of a memory system.

Various examples of the disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete, and fully conveys the disclosure to those skilled in the art to which the invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

FIG. 1 is a block diagram illustrating an embodiment of a memory system 110, which may include a memory device 150 that stores data and a controller 130 which controls the memory device 150, for example, under control of a host 102.

The host 102 may include at least one operating system (OS), which manages and controls functions and operations performed in the host 102. The OS can also provide interoperability between the host 102 engaged with the memory system 110 and a user of the memory system 110. The OS may support functions and operations corresponding to user requests.

By way of example but not limitation, the OS can be classified into a general operating system and a mobile operating system according, for example, to mobility of the host 102. A general operating system may include a personal operating system or an enterprise operating system according to system requirements and/or user environment. A personal operating system (e.g., Windows, Chrome, etc.) may be subject to support services for various purposes. Enterprise operating systems can be specialized for securing and supporting high performance. Examples of these types of operating systems include Windows servers, Linux, Unix, and the like.

Mobile operating systems include, for example, Android, iOS, Windows mobile, and others. A mobile operating system may be subject to support services or functions for mobility (e.g., a power saving function).

In some cases, the host 102 may include a plurality of operating systems. The host 102 may execute multiple operating systems interlocked with the memory system 110, corresponding to a user request. The host 102 may transmit a plurality of commands corresponding to the user requests to the memory system 110, to thereby perform operations corresponding to the commands within the memory system 110.

Storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and a flash memory.

The controller 130 and the memory device 150 in the memory system 110 may be integrated into a single semiconductor device, which may be included in any of various types of memory systems as discussed above in the examples.

By way of example but not limitation, the controller 130 and memory device 150 may be implemented with a solid-state drive (SSD). When the memory system 110 is implemented as an SSD, the operating speed of the host 102 connected to the memory system 110 can be improved more than that of when the host 102 is implemented with a hard disk. In one embodiment, the controller 130 and the memory device 150 may be integrated into one semiconductor device to form a memory card, e.g., such as a PC card (PCMCIA), a compact flash card (CF), a memory card such as a smart media card (SM, SMC), a memory stick, a multimedia card (MMC, RS-MMC, MMCmicro), a SD card (SD, miniSD, microSD, SDHC), and a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may receive commands CMD and addresses ADD from the memory controller 130 through a channel, and may access areas of a memory cell array corresponding to the addresses ADD. For example, the memory device 150 may perform an internal operation corresponding to a command CMD on an area selected by an address ADD. In one embodiment, the memory device 150 may perform a program operation on a selected block in response to the command CMD, the address ADD, and data which correspond to the program operation. Further, the memory device 150 may perform a read operation on a selected memory block in response to a command CMD and an address ADD which correspond to a read operation, and may output the read data to the memory controller 130.

The controller 130 may control overall operations of the memory device 150, such as read, write, program and erase operations. For example, the controller 130 may control the memory device 150 in response to a request from the host 102. The controller 130 may provide data, read from the memory device 150, to the host 102. The controller 130 may also store data, provided by the host 102, into the memory device 150.

Each of the memory device 150 and the memory controller 130 may be supplied with an external supply voltage VCCE and then may be operated. For example, the memory device 150 may be supplied with the external supply voltage VCCE to generate one or more internal voltages, and may perform overall or predetermined operations using the one or more internal voltages.

In an embodiment, the memory system 110 may include a single memory device 150, but may include a plurality of memory devices 150 in another embodiment. During a power-up interval of the memory system 110, a plurality of memory devices 150 may simultaneously generate one or more internal voltages using the external supply voltage VCCE. Thus, a problem may arise where instantaneous current consumption is increased based on generation of the internal voltages. This, in turn, may cause peak current to increase.

Figure 2:
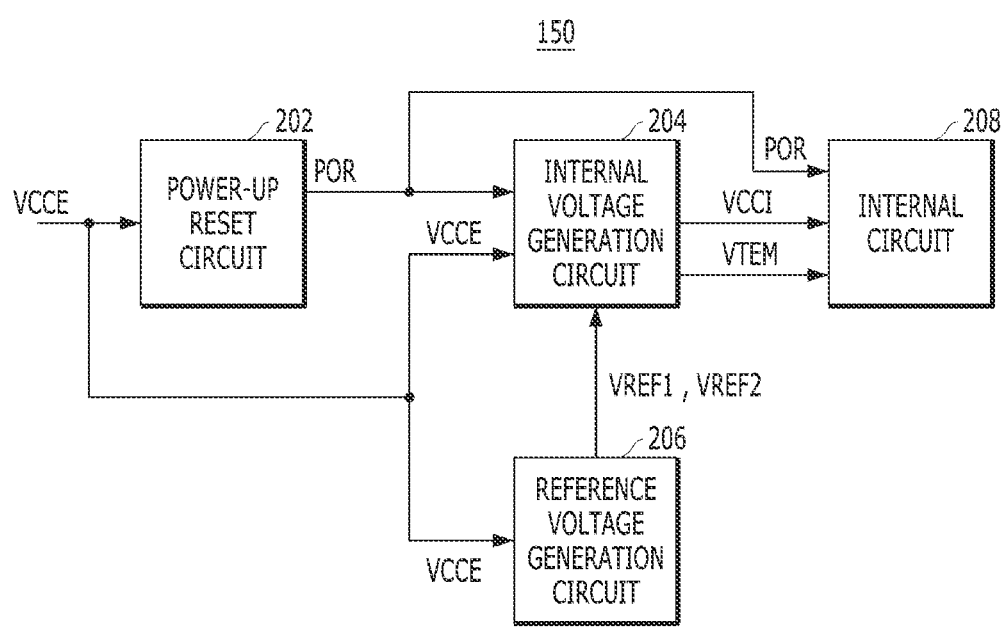
FIG. 2 illustrates an embodiment of a memory device.

FIG. 2 illustrates an embodiment of memory device 150, which may include a power-up reset circuit 202, an internal voltage generation circuit 204, a reference voltage generation circuit 206, and an internal circuit 208.

The power-up reset circuit 202 may detect a potential level of an external power voltage VCCE and then generate and output a power-up reset signal POR. For example, the power-up reset circuit 202 may change and output the logic level of the power-up reset signal POR when the potential level of the external power voltage VCCE rises over a preset level during a power-up operation of the memory system. Here, a time point at which the logic level of the power-up reset signal POR changes when the external power voltage VCCE exceeds the preset level may be defined as a first time point. Therefore, the first time point may be later than a power-up time point at which power is supplied to the memory system 110.

The reference voltage generation circuit 206 may receive the external power voltage VCCE and generate and output a first reference voltage VREF1 and a second reference voltage VREF2, each of which, for example, may a constant level. In one embodiment, the reference voltage generation circuit 206 may be implemented as a bandgap reference circuit, which supplies a reference voltage or reference current having a constant level and, for example, which is not influenced by variations in power voltage or temperature or by process variations. The constant level may be achieved, for example, based on output characteristics which have a negative (−) temperature coefficient and a positive (+) temperature coefficient that are offset with each other. In one embodiment, each of the first reference voltage VREF1 and the second reference voltage VREF2 may have a constant level regardless of a variation in PVT (process, voltage and temperature) during a power-up period.

The internal voltage generation circuit 204 may start to operate in response to the power-up reset signal POR. For example, the internal voltage generation circuit 204 may start to operate at the first time point. The internal voltage generation circuit 204 may receive the external power voltage VCCE and generate an internal voltage VCCI. During the power-up period, the internal voltage generation circuit 204 may prevent the voltage level of the internal voltage VCCI from rising too abruptly (e.g., above a predetermined rate). This may be accomplished, for example, by appropriately adjusting the rate at which the voltage level of the internal voltage VCCI increases, which, in turn, may suppress an abrupt rise in current consumption.

The internal circuit 208 may be initialized in response to the power-up reset signal POR output from the power-up reset circuit 202 or a selection signal VTEM output from the internal voltage generation circuit 204. The internal voltage generation circuit 204 may generate the selection signal VTEM and transfer the selection signal VTEM to the internal circuit 208, when the generation of the internal voltage VCCI is completed, e.g., when it is checked that the potential level of the internal voltage VCCI generated therein reaches a target potential level. The internal circuit 208 may operate using the internal voltage VCCI (generated in the internal voltage generation circuit 204) as supplied power and may perform an operation (e.g., a write/program operation of storing data, a read operation of reading stored data, an erase operation of erasing stored data) in response to a command, an address and data received from the controller 130 of FIG. 1.

Figure 3:
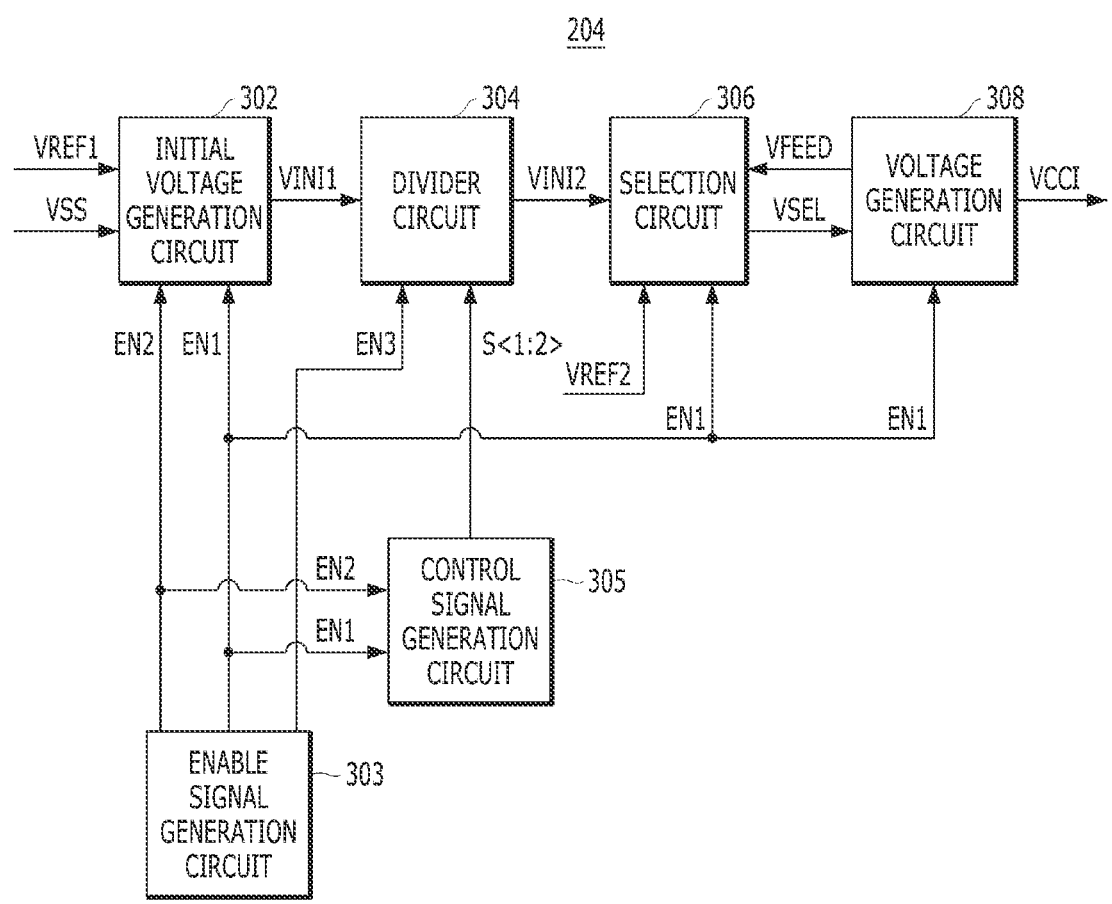
FIG. 3 illustrates an embodiment of an internal voltage generation circuit.

FIG. 3 illustrates an embodiment of the internal voltage generation circuit (or voltage generator) 204, which may include an initial voltage generation circuit (or first voltage generator) 302, a divider circuit (or divider) 304, a selection circuit (or selector) 306, a voltage generation circuit (or second voltage generator) 308, an enable signal generation circuit (or enable signal generator) 303, and a control signal generation circuit (or control signal generator) 305.

The internal voltage generation circuit 204 may output a second initial voltage VINI2 by dividing, at a first preset ratio, the potential level of a first initial voltage VINI1. The first initial voltage VINI1 may be generated by the initial voltage generation circuit 302 buffering the first reference voltage VREF1 from the first time point (at which the power-up reset signal POR transitions as the potential level of the external power voltage VCCE rises over the preset level) to a second time point later than the first time point. After the second time point, the first initial voltage VINI1 having a potential level that rises with a constant slope may be output as the second initial voltage VINI2. This may be accomplished by integrating the difference between the first reference voltage VREF1 and a predetermined reference (e.g., ground) voltage VSS. The internal voltage VCCI may be generated by receiving or blocking the external power voltage VCCE depending on a result of comparing the potential levels of any one voltage of the second initial voltage VINI2 and the second reference voltage VREF2 and a feedback voltage VFEED.

The power-up reset signal POR may be generated in the power-up reset circuit 202 described above with reference to FIG. 2. The first reference voltage VREF1 and the second reference voltage VREF2 may be generated in the reference voltage generation circuit 206 described above with reference to FIG. 2. The feedback voltage VFEED may be generated in the voltage generation circuit 308 in the internal voltage generation circuit 204, and may have a potential level obtained by dividing the potential level of the internal voltage VCCI at a second preset ratio.

In operation, the initial voltage generation circuit 302 may generate the first initial voltage VINI1 by buffering the first reference voltage VREF1 input from the first time point to the second time point later. The first time point may be later in time than the power-up time point, and the second time point may be later in time that the first time point. The initial voltage generation circuit 302 may then generate the first initial voltage VINI1 by integrating the difference between the first reference voltage VREF1 (input after the second time point) and a predetermined reference voltage VSS. In one embodiment, the potential of the first initial voltage VINI1 may rise with a constant slope and the reference voltage VSS may be a ground voltage.

The potential level of the first initial voltage VINI1 (generated through the integration operation in the initial voltage generation circuit 302) may be a potential level obtained by dividing the difference in potential level between the first reference voltage VREF1 and the ground voltage VSS by a preset resistance value.

In one embodiment, the power-up time point may correspond to a time point at which supply of the external power voltage VCCE starts, and the first time point may correspond to a time point at which the potential level of the external power voltage VCCE rises over the preset level. Therefore, the first time point at which the potential level of the external power voltage VCCE rises over the preset level may be later in time than the power-up time point.

The divider circuit 304 may divide the potential level of the first initial voltage VINI1, at the first preset ratio, from the first time point to the second time point. Then, the divider circuit 304 may output the second initial voltage VINI2 based on a result of the division. In one embodiment, the divider circuit 304 may output the first initial voltage VINI1 as the second initial voltage VINI2 after the second time point.

For example, the divider circuit 304 may be coupled to the output terminal of the initial voltage generation circuit 302, and may output the second initial voltage VINI2 by dividing the potential level of the first initial voltage VINI1 at the first preset ratio. In one embodiment, the first preset ratio may be changed according to a predetermined order in a plurality of periods between the first time point and the second time point. The change in preset ratio will produce a proportional change in the level of the first initial voltage VINI1. This may result, for example, from changing the combination of resistors coupled within the divider circuit.

The plurality of periods between the first time point and the second time point may be set in advance, for example, by a designer. For example, the number of periods to be set as the plurality of periods between the first time point and the second time point may be set in advance by a designer. Additionally, or alternatively, the lengths of each of the plurality of periods may be set in advance by a designer.

In one implementation, the period between the first time point and the second time point may be divided by N number of time points with constant intervals, such that the plurality of periods include a total of N+1 number of periods. (N is a natural number equal to or greater than 1). When N is 1, two periods may be set based on one time point between the first time point and the second time point.

The selection circuit 306 may compare the potential levels of the feedback voltage VFEED and the second reference voltage VREF2, and may select the second initial voltage VINI2 or the second reference voltage VREF2 based on the comparison to generate output voltage VSEL. For example, the selection circuit 306 may output the second initial voltage VINI2 from the first time point to a third time point (at which the potential levels of the feedback voltage VFEED and the second reference voltage VREF2 become equal to each other) and may output the second reference voltage VREF2 after the third time point.

The third time point may be later in time than the second time point. This is because the second initial voltage VINI2 has, between the first time point and the second time point, a potential level lower than the second reference voltage VREF2 (which has a potential level equal to or higher than the first reference voltage VREF1). This may be so because the potential level of the second initial voltage VINI2 is determined by dividing, at the first preset ratio, the potential level of the buffered first reference voltage VREF1 (which rises with a constant slope from the second time point). Thus, from the first time point to the third time point, the second initial voltage VINI2 may have a potential level lower than the second reference voltage VREF2.

The voltage generation circuit 308 may generate the internal voltage VCCI. In operation, the voltage generation circuit 308 may receive or block the external power voltage VCCE depending on a result of comparing the potential levels of the output voltage VSEL and feedback voltage VFEED. For example, the voltage generation circuit 308 may adjust the potential level of the internal voltage VCCI by adjusting the amount of current supplied from a node of the external power voltage VCCE to a node of the internal voltage VCCI. The potential may be adjusted, for example, depending on the result of comparing the potential levels of the output voltage VSEL and the feedback voltage VFEED. The voltage generation circuit 308 may generate the feedback voltage VFEED by dividing the potential level of the internal voltage VCCI, generated therein, at a second preset ratio.

For example, the voltage generation circuit 308 may receive the second initial voltage VINI2 from the selection circuit 306 from the first time point to the third time point, and may raise the potential level of the internal voltage VCCI by comparing the potential levels of the second initial voltage VINI2 and feedback voltage VFEED. In this regard, as described above, the potential level of the second initial voltage VINI2 may have (between the first time point and the second time point) a value obtained by dividing the potential level of the buffered first reference voltage VREF1 at the first preset ratio, and may have a value rising with a constant slope between the second time point and the third time point. Therefore, when generating the internal voltage VCCI between the first time point and the third time point, the voltage generation circuit 308 may prevent (between the first time point and the second time point) an abrupt increase in the amount of current consumption, and may reduce (between the second time point and the third time point) the amount of current consumption by decreasing the speed at which the potential level of the internal voltage VCCI rises.

In one embodiment, the first preset ratio and the second preset ratio may correspond to division ratios having different values. In one embodiment, the first preset ratio and the second preset ratio may be determined in advance by a designer and may be determined independently from one another, for example, through a selection of resistance values in the divider circuit.

The enable signal generation circuit 303 may generate a first enable signal EN1, a second enable signal EN2 and a third enable signal EN3 in response to the power-up reset signal POR. The enable signal generation circuit 303 may activate the first enable signal EN1 at the first time point (at which the power-up reset signal POR transitions as the potential level of the external power voltage VCCE rises over the preset level). The enable signal generation circuit 303 may activate the second enable signal EN2 at the second time point later than the first enable signal EN1 by a preset delay amount. The enable signal generation circuit 303 may generate the third enable signal EN3 to maintain an activated state between the first time point and the second time point. The first enable signal EN1 and the second enable signal EN2 may be deactivated, for example, at the same time point.

In one embodiment, the first enable signal EN1 and the second enable signal EN2 may be activated at the first time point and the second time point, respectively. Therefore, initial voltage generation circuit 302 (which operates in response to the first enable signal EN1 and the second enable signal EN2) may generate the first initial voltage VINI1 by buffering the first reference voltage VREF1 in response to activation of the first enable signal EN1. The initial voltage generation circuit 302 may generate the first initial voltage VINI1 to have a potential level that rises with a constant slope. This may be accomplished by integrating the difference between the first reference voltage VREF1 and the ground voltage VSS in response to activation of the second enable signal EN2. The selection circuit 306 and the voltage generation circuit 308 may start to operate in response to activation of the first enable signal EN1 and may continue to operate during a period in which the first enable signal EN1 is maintained in the activated state.

The control signal generation circuit 305 may generate a plurality of control signals S<1:2> in response to the first enable signal EN1 and the second enable signal EN2. The plurality of control signals S<1:2> may be activated in a predetermined order in each of the periods between the first time point and the second time point. The order of activation may control the different division ratios of the divider circuit.

The third enable signal EN3 may maintain an activated state between the first time point and the second time point, and the control signals S<1:2> generated by the control signal generation circuit 305 may be activated in the predetermined order in each of the periods between the first time point and the second time point. Accordingly, the divider circuit 304 (which operates in response to the third enable signal EN3 and the plurality of control signals S<1:2>) may output the second initial voltage VINI2 by dividing the potential level of the first initial voltage VINI1 at the first preset ratio. In one embodiment, the first preset ratio may be changed in response to the plurality of control signals S<1:2> during an activation period of the third enable signal EN3. The divider circuit 304 may output the first initial voltage VINI1 as the second initial voltage VINI2 during a deactivation period of the third enable signal EN3.

Figure 4:
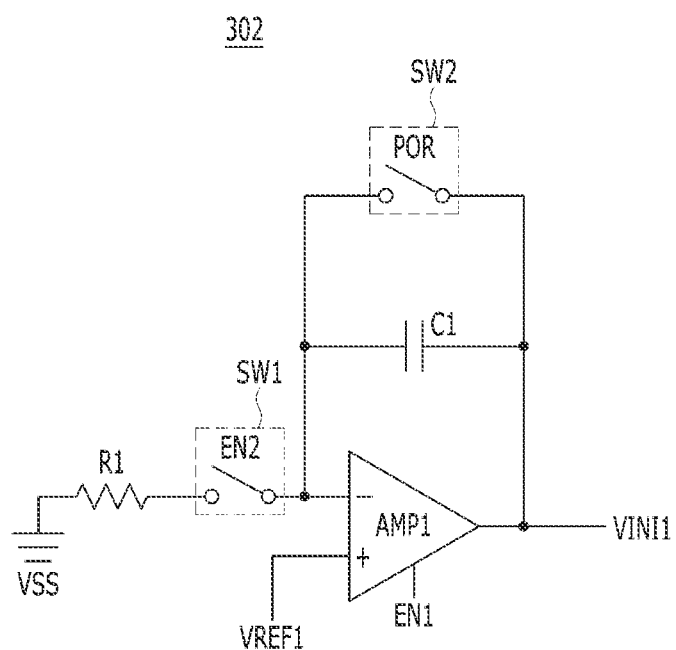
FIG. 4 illustrates an embodiment of an initial voltage generation circuit.

FIG. 4 illustrates an embodiment of the initial voltage generation circuit 302, which may be configured to include a resistor R1, a capacitor C1, an amplifier AMP1, a first switch SW1, and a second switch SW2. The resistor R1 has a first node coupled to a terminal of reference (e.g., ground) voltage VSS and a second node coupled to a first node of the first switch SW1. A second node of the first switch SW1 is coupled to a first node of the second switch SW2, a first node of the capacitor C1, and a first input terminal (−) of the amplifier AMP1. The first switch SW1 may be controlled by the second enable signal EN2.

The amplifier AMP1 has the first input terminal (−) coupled to the second node of the first switch SW1, the first node of the second switch SW2 and the first node of the capacitor C1, a second input terminal (+) coupled to a terminal of the first reference voltage VREF1, and an output terminal coupled to a second node of the second switch SW2, a second node of the capacitor C1 and a terminal of the first initial voltage VINI1. The amplifier AMP1 may be controlled by the first enable signal EN1.

The capacitor C1 has its first node coupled to the second node of the first switch SW1, the first node of the second switch SW2 and the first input terminal (−) of the amplifier AMP1, and its second node coupled to the second node of the second switch SW2, the output terminal of the amplifier AMP1 and the terminal of the first initial voltage VINI1.

The second switch SW2 has its first node coupled to the second node of the first switch SW1, the first node of the capacitor C1 and the first input terminal (−) of the amplifier AMP1, and its second node coupled to the second node of the capacitor C1, the output terminal of the amplifier AMP1 and the terminal of the first initial voltage VINI1. The second switch SW2 may be controlled by the power-up reset signal POR.

Operation of the initial voltage generation circuit 302 may be described as follows. When the second switch SW2 is switched from a closed state to an open state as the power-up reset signal POR transitions from an activated state to a deactivated state, the initial voltage generation circuit 302 may start to operate.

During a period in which the first enable signal EN1 is activated as the power-up reset signal POR transitions and the second enable signal EN2 maintains a deactivated state (e.g., during the period between the first time point and the second time point), the amplifier AMP1 starts to operate. However, the first switch SW1 is in an open state at this time. Thus, only the output terminal of the amplifier AMP1 and the terminal of the first initial voltage VINI1 may be coupled to the first input terminal (−) of the amplifier AMP1, with the capacitor C1 interposed therebetween. In other words, the resistor R1 may not be coupled to the first input terminal (−) of the amplifier AMP1.

The terminal of the first reference voltage VREF1 may be coupled to the second input terminal (+) of the amplifier AMP1. Accordingly, the amplifier AMP1 may operate as a unit gain buffer during the period between the first time point and the second time point. For example, during the period between the first time point and the second time point, the amplifier AMP1 may buffer the first reference voltage VREF1 received through the second input terminal (+) and may output the buffered first reference voltage VREF1 as the first initial voltage VINI1.

During a period in which both the first enable signal EN1 and the second enable signal EN2 are activated (e.g., during a period after the second time point), the first switch SW1 is switched to a closed state. Thus, not only the output terminal of the amplifier AMP1 and the terminal of the first initial voltage VINI1 may be coupled to the first input terminal (−) of the amplifier AMP1 (with the capacitor C1 interposed therebetween), but also the resistor R1 may be coupled to the first input terminal (−) of the amplifier AMP1. Thus, during the period after the second time point, the amplifier AMP1 may operate as an integration circuit. For example, during the period after the second time point, the amplifier AMP1 may output the first initial voltage VINI1 (whose potential level rises with a constant slope) by integrating the difference in potential level between the ground voltage VSS received through the first input terminal (−) and the first reference voltage VREF1 received through the second input terminal (+).

Figure 5:
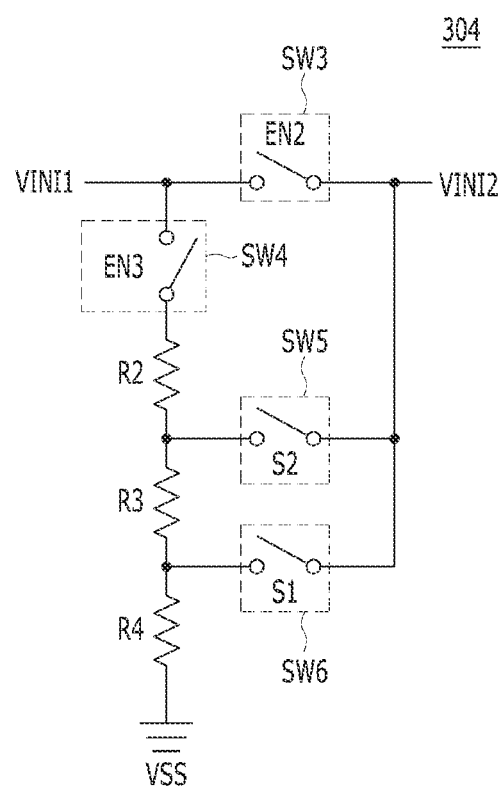
FIG. 5 illustrates an embodiment of a divider circuit.

FIG. 5 illustrates an embodiment of the divider circuit 304, which may be configured to include a third switch SW3, a fourth switch SW4, a fifth switch SW5, a sixth switch SW6, a second resistor R2, a third resistor R3, and a fourth resistor R4.

The third switch SW3 has a first node coupled to a terminal of the first initial voltage VINI1 and a first node of the fourth switch SW4, and a second node coupled to a terminal of the second initial voltage VINI2, a second node of the fifth switch SW5 and a second node of the sixth switch SW6. The third switch SW3 may be controlled by the second enable signal EN2.

The fourth switch SW4 has its first node coupled to the terminal of the first initial voltage VINI1 and the first node of the third switch SW3, and a second node coupled to a first node of the second resistor R2. The fourth switch SW4 may be controlled by the third enable signal EN3.

The fifth switch SW5 has a first node coupled to a second node of the second resistor R2 and a first node of the third resistor R3, and its second node coupled to the terminal of the second initial voltage VINI2, the second node of the third switch SW3 and the second node of the sixth switch SW6. The fifth switch SW5 may be controlled by the second control signal S2 of the plurality of control signals S<1:2>.

The sixth switch SW6 has a first node coupled to a second node of the third resistor R3 and a first node of the fourth resistor R4, and its second node coupled to the terminal of the second initial voltage VINI2, the second node of the third switch SW3 and the second node of the fifth switch SW5. The sixth switch SW6 may be controlled by the first control signal S1 of the plurality of control signals S<1:2>.

The second resistor R2 has its first node coupled to the second node of the fourth switch SW4 and its second node coupled to the first node of the fifth switch SW5 and the first node of the third resistor R3.

The third resistor R3 has its first node coupled to the first node of the fifth switch SW5 and the second node of the second resistor R2, and its second node coupled to the first node of the sixth switch SW6 and the first node of the fourth resistor R4.

The fourth resistor R4 has its first node coupled to the first node of the sixth switch SW6 and the second node of the third resistor R3, and a second node coupled to a terminal of the ground voltage VSS.

Operation of the divider circuit 304 may be described as follows. During a period in which the third enable signal EN3 maintains an activated state but the second enable signal EN2 maintains a deactivated state (e.g., during the period between the first time point and the second time point), the third switch SW3 is in an open state and the fourth switch SW4 is in a closed state. Thus, the terminal of the first initial voltage VINI1 and the terminal of the second initial voltage VINI2 are not coupled to each other, and the terminal of the first initial voltage VINI1 is coupled to the first node of the second resistor R2.

Between the first time point (at which the third enable signal EN3 is activated) and the second time point (at which the third enable signal EN3 is deactivated), the plurality of control signals S<1:2> may be activated in a predetermined order in the periods between the first time point and the second time point. According to an embodiment, it may be assumed that the first control signal S1 of the plurality of control signals S<1:2> is activated first at the first time point and then the first control signal S1 is deactivated and the second control signal S2 is activated at a middle time point between the first time point and the second time point.

Accordingly, the second initial voltage VINI2 may be output by dividing the potential level of the first initial voltage VINI1 at the first preset ratio. The potential level of the first initial voltage VINI1 may be changed based on the varying states of the control signals S<1:2> in the periods between the first time point and the second time point. In other words, changing the order of activation of the control signals S<1:2> changes the division ratio of the divider circuit, which, in turn, changes the potential level of the first initial voltage VINI1. The first initial voltage VINI1 may be output as the second initial voltage VINI2 after the second time point.

More specifically, according to an embodiment, during a period in which the first control signal S1 of the plurality of control signals S<1:2> is activated and the second control signal S2 is deactivated, the second initial voltage VINI2 may be output by dividing the potential level of the first initial voltage VINI1. The potential level of the first initial voltage VINI1 may be divided by applying, as the first preset ratio, a division ratio determined depending on the difference between a summed resistance value of the second resistor R2 and the third resistor R3 and a resistance value of the fourth resistor R4.

During a period in which the second control signal S2 of the plurality of control signals S<1:2> is activated and the first control signal S1 is deactivated, the second initial voltage VINI2 may be output by dividing the potential level of the first initial voltage VINI1. The second initial voltage VINI2 may be divided by applying, as the first preset ratio, a division ratio determined depending on the difference between a resistance value of the second resistor R2 and a summed resistance value of the third resistor R3 and the fourth resistor R4.

In the case where all of the second resistor R2, the third resistor R3 and the fourth resistor R4 have the same value, the level of the second initial voltage VINI2 (output during the period in which the first control signal S1 of the plurality of control signals S<1:2> is activated and the second control signal S2 of the plurality of control signals S<1:2> is deactivated) will be relatively lower than the level of the second initial voltage VINI2 output during the period in which the second control signal S2 of the plurality of control signals S<1:2> is activated and the first control signal S1 of the plurality of control signals S<1:2> is deactivated.

Figure 6:
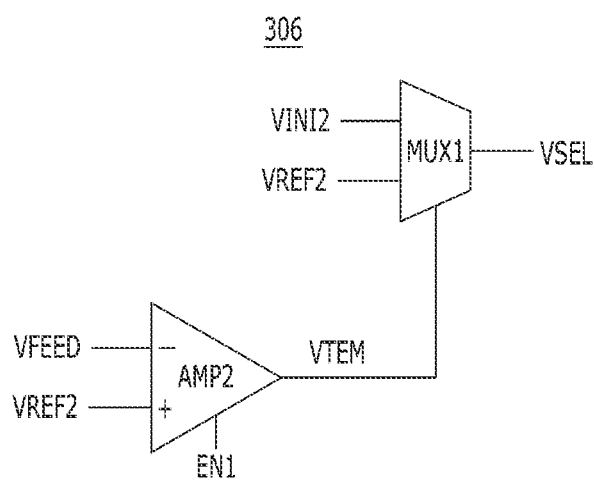
FIG. 6 illustrates an embodiment of a selection circuit.

FIG. 6 illustrates an embodiment of the selection circuit 306, which may include a comparator AMP2 and a multiplexer MUX1. The comparator AMP2 may generate the selection signal VTEM based on a result of comparing potential levels of the feedback voltage VFEED and the second reference voltage VREF2.

The multiplexer MUX1 may receive the second initial voltage VINI2 and the second reference voltage VREF2 and may select and output any one of the second initial voltage VINI2 or the second reference voltage VREF2 in response to the selection signal VTEM. For example, the comparator AMP2 has a first input terminal (−) coupled to a terminal of the feedback voltage VFEED, a second input terminal (+) coupled to a terminal of the second reference voltage VREF2, and an output terminal coupled to a terminal of the selection signal VTEM. The comparator AMP2 may be controlled by the first enable signal EN1.

The multiplexer MUX1 has a first input terminal coupled to a terminal of the second initial voltage VINI2, a second input terminal coupled to a terminal of the second reference voltage VREF2, and an output terminal coupled to a terminal of the output voltage VSEL. The multiplexer MUX1 may be controlled by the selection signal VTEM.

Operation of the selection circuit 306 may be described as follows.

The comparator AMP2 may be activated in response to the first enable signal EN1, may receive and compare the feedback voltage VFEED and the second reference voltage VREF2, and may generate and output the selection signal VTEM depending on a comparison result. For example, the comparator AMP2 may generate and output the selection signal VTEM having a first logic level (e.g., a low level) when the potential level of the feedback voltage VFEED is higher than the potential level of the second reference voltage VREF2 and may generate and output the selection signal VTEM having a second logic level (e.g., a high level) when the potential level of the feedback voltage VFEED is lower than the potential level of the second reference voltage VREF2.

The multiplexer MUX1 may receive the second initial voltage VINI2 and the second reference voltage VREF2 and may select and output the second initial voltage VINI2 or the second reference voltage VREF2 as the output voltage VSEL in response to the selection signal VTEM. For example, when the selection signal VTEM is the first logic level, the multiplexer MUX1 may select and output the second reference voltage VREF2 as the output voltage VSEL. Conversely, when the selection signal VTEM is the second logic level, the multiplexer MUX1 may select and output the second initial voltage VINI2 as the output voltage VSEL.

In other words, the selection circuit 306 may output the second initial voltage VINI2 as the output voltage VSEL when the potential level of the second reference voltage VREF2 is higher than the potential level of the feedback voltage VFEED, and may output the second reference voltage VREF2 as the output voltage VSEL when the potential level of the second reference voltage VREF2 is lower than the potential level of the feedback voltage VFEED.

Figure 7:
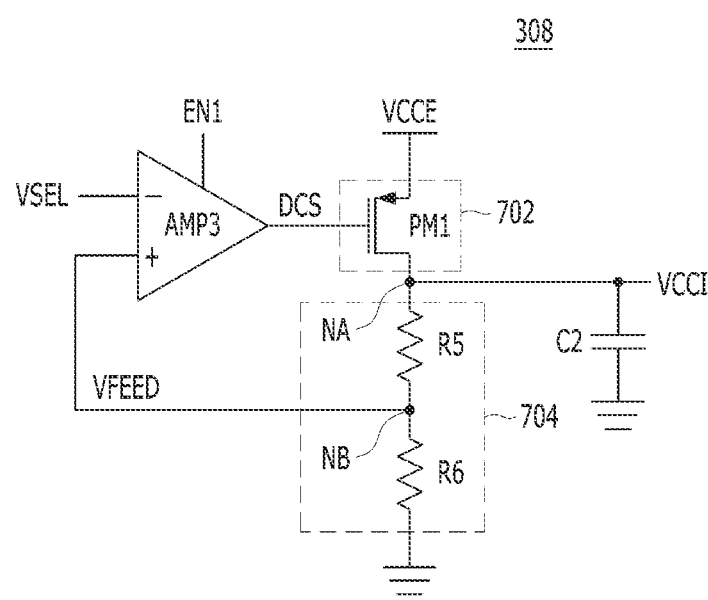
FIG. 7 illustrates an embodiment of a voltage generation circuit.

FIG. 7 illustrates an embodiment of voltage generation circuit 308, which may include an amplifier AMP3, a current supply circuit 702, and a voltage divider circuit 704. The amplifier AMP3 may start to operate in response to the first enable signal EN1 and may generate and output a driving control signal DCS by comparing the output voltage VSEL and the feedback voltage VFEED (output from the voltage divider circuit 704). For example, the amplifier AMP3 may generate and output the driving control signal DCS having a first logic level (e.g., a low level) when the potential level of the output voltage VSEL is higher than the potential level of the feedback voltage VFEED, and may generate and output the driving control signal DCS having a second logic level (e.g., a high level) when the potential level of the output voltage VSEL is lower than the potential level of the feedback voltage VFEED.

The current supply circuit 702 may apply the external power voltage VCCE to an output node NA or block the external power voltage VCCE in response to the driving control signal DCS. For example, the current supply circuit 702 may be configured by a PMOS transistor PM1 coupled between a terminal to which the external power voltage VCCE is applied and the output node NA. The PMOS transistor PM1 may be turned on or off in response to the driving control signal DCS and may apply the external power voltage VCCE to the output node NA or block the external power voltage VCCE.

The voltage divider circuit 704 may be coupled between the output node NA and a terminal of the ground voltage VSS. The voltage divider circuit 704 may generate the feedback voltage VFEED by voltage-dividing the potential level of the output node NA, that is, the internal voltage VCCI. For example, the voltage divider circuit 704 may be configured to include fifth and sixth resistors R5 and R6 which are coupled in series between the output node NA and the terminal of the ground voltage VSS. The voltage divider circuit 704 may voltage-divide the internal voltage VCCI according to a ratio corresponding to the difference between a resistance value of the fifth resistor R5 and a resistance value of the sixth resistor R6 (e.g., the second preset ratio), and thereby may output the feedback voltage VFEED through a node NB between the fifth and sixth resistors R5 and R6.

When the internal voltage VCCI generated by the voltage generation circuit 308 is lower than a target potential level, the feedback voltage VFEED (which is generated by voltage-dividing the internal voltage VCCI) may have a potential level lower than the output voltage VSEL. As a result, the amplifier AMP3 may output the driving control signal DCS to have the first logic level, and the current supply circuit 702 may raise the potential level of the internal voltage VCCI by applying the external power voltage VCCE to the output node NA in response to the driving control signal DCS. When the internal voltage VCCI is higher than the target potential level, the feedback voltage VFEED (which is generated by voltage-dividing the internal voltage VCCI) may have a potential level higher than the output voltage VSEL. As a result, the amplifier AMP3 may output the driving control signal DCS having the second logic level, and the current supply circuit 702 may block the application of the external power voltage VCCE to the output node NA, in response to the driving control signal DCS. Thus, the potential level of the internal voltage VCCI may not rise anymore and may maintain a constant level.

In the voltage generation circuit 308, a capacitor C2 may be coupled to the output node NA from which the internal voltage VCCI is output. This may stabilize level variation of the internal voltage VCCI. As the size of the capacitor C2 coupled to the output node NA increases, level variation of the internal voltage VCCI may be stably maintained. However, this may cause a problem in the internal voltage generation circuit of FIG. 1. For example, the amount of instantaneous current consumption may increase as a result of generating the internal voltage during an initial operation of the internal voltage generation circuit. This, in turn, may cause peak current to increase.

Figure 8:
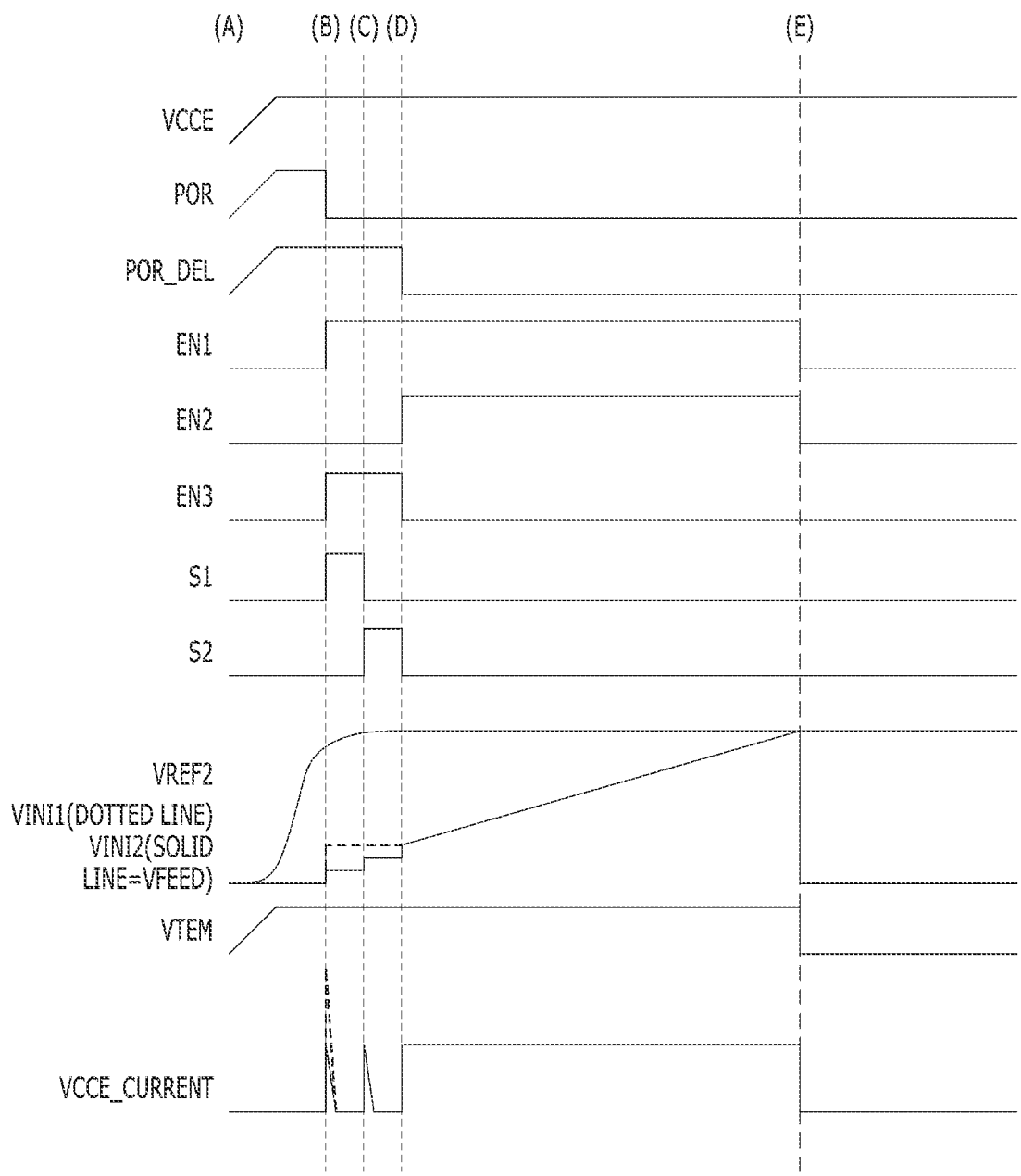
FIG. 8 illustrates an embodiment of a waveform diagram including signals for generating an internal voltage in a memory device.

FIG. 8 illustrates an embodiment of a waveform diagram including signals for generating an internal voltage in a memory device as described herein.

Referring to FIG. 8, from a power-up time point (A) at which power is supplied to memory device 150, the level of the external power voltage VCCE may start to rise. When it is checked that the level of the external power voltage VCCE has risen over the preset level, the logic level of the power-up reset signal POR may transition to a low level.

A time point (B), at which the logic level of the power-up reset signal POR transitions, may be defined as the first time point. From the power-up time point (A) to the time point (B) at which the logic level of the power-up reset signal POR transitions, various signals EN1, EN2, EN3, S1, S2, VINI2 and VFEED used inside the memory device 150 may maintain states in which they are locked to initial or predetermined logic levels. In the case of the second reference voltage VREF2 (which is generated by the reference voltage generation circuit 206 configured by a bandgap reference circuit) and the selection signal VTEM (which is directly influenced by a level variation of the second reference voltage VREF2), the potential levels thereof may rise together as the potential level of the external power voltage VCCE rises between the power-up time point (A) and the time point (B) at which the logic level of the power-up reset signal POR transitions.

For reference, only a level variation of the second reference voltage VREF2 is illustrated as an example in which the level of a reference voltage rises as the level of the external power voltage VCCE rises. However, this is for the sake of convenience in explanation, and in one embodiment the level of the first reference voltage VREF1 may also rise like the second reference voltage VREF2. In one embodiment, the level of the first reference voltage VREF1 may be set to a level lower than or equal to the level of the second reference voltage VREF2.

At the time point (B) at which the logic level of the power-up reset signal POR transitions (e.g., the first time point), the first enable signal EN1 and the third enable signal EN3 may be activated.

At time point (D), which is later in time by a preset delay amount than the time point (B) at which the logic level of the power-up reset signal POR transitions, the logic level of a delay signal POR_DEL of the power-up reset signal POR may transition. The time point (D) at which the logic level of the delay signal POR_DEL of the power-up reset signal POR transitions may correspond to the second time point.

At time point (D), at which the logic level of the delay signal POR_DEL of the power-up reset signal POR transitions (e.g., at the second time point), the second enable signal EN2 may be activated and the third enable signal EN3 may be deactivated.

At least one middle time point (C) may be selected between the time point (B) at which the logic level of the power-up reset signal POR transitions and the time point (D) at which the logic level of the delay signal POR_DEL of the power-up reset signal POR transitions, e.g., between the first time point and the second time point.

Based on the middle time point (C) selected in this way, the plurality of control signals S<1:2> may be sequentially activated in a predetermined order. For example, when it is assumed that there is one middle time point (C), the first control signal S1 of the plurality of control signals S<1:2> may be activated from the time point (B) at which the logic level of the power-up reset signal POR transitions (e.g., the first time point) to the middle time point (C). In succession, the second control signal S2 of the plurality of control signals S<1:2> may be activated from the middle time point (C) to the second time point.

While it is illustrated in the drawing that only one middle time point (C) is selected between the first time point and the second time point, this is because it is assumed that the plurality of control signals S<1:2> include two signals, namely the first control signal S1 and the second control signal S2. When more control signals are included, more middle time points may be selected.

As described above with reference to FIGS. 1 to 3 and 7, a plurality of internal voltage generation circuits may be included in one memory device 150. Each internal voltage generation circuit may include voltage generation circuit 308 for directly driving and generating the internal voltage VCCI and capacitor C2 for stabilizing the potential level of the internal voltage VCCI at the output node NA of the voltage generation circuit 308.

However, when the voltage generation circuit 308 is initialized during an initial operation period of the internal voltage generation circuit (e.g., between the first time point and the second time point), the level of the output voltage VSEL input to the voltage generation circuit 308 may abruptly increase, which, in turn, may abruptly increase the level of the internal voltage VCCI generated by the voltage generation circuit 308. When the level of the internal voltage VCCI abruptly increases in this way, peak current may increase even more substantially due to the presence of capacitor C2 at the output terminal of the internal voltage VCCI.

For example, it may be seen from the example of FIG. 8 that an abrupt increase (e.g., see dotted line) may occur in the potential level of the output voltage VSEL (on which only a rise in the level of the first initial voltage VINI1 is reflected) input to the voltage generation circuit 308 at the first time point. This may produce a significant increase in the amount of instantaneous current consumption for the external power voltage VCCE.

In accordance with one or more embodiments, the internal voltage generation circuit 204 may control the rise in levels of the second initial voltage VINI2 and the feedback voltage VFEED between the first time point and the second time point to occur in a stepwise manner (or more gradual manner different from a stepwise manner) through a plurality of periods (a solid line). In other words, as described above with reference to FIG. 3, in one embodiment the divider circuit 304 may perform the operation of determining the potential level of the second initial voltage VINI2 by dividing the potential level of the first initial voltage VINI1 at the first preset ratio (which, for example, may be changed between the first time point and the second time point) and outputting the first initial voltage VINI1 as the second initial voltage VINI2 after the second time point.

Therefore, in accordance with one or more embodiments, the internal voltage generation circuit 204 may control the potential levels of the second initial voltage VINI2 and the feedback voltage VFEED to rise in a stepwise manner (or more gradual manner different from a stepwise manner) through the plurality of periods between the first time point and the second time point. As a result, any rise in the amount of instantaneous current consumption for the external power voltage VCCE may be controlled to increase, little by little (e.g., more gradually or below a predetermined rate), in a dispersed pattern over a plurality of periods (e.g., a solid line). In accordance with one embodiment, the internal voltage generation circuit 204 may control the potential levels of the second initial voltage VINI2 and the feedback voltage VFEED to rise with a constant slope after the second time point.

The selection circuit 306 and the voltage generation circuit 308 in the internal voltage generation circuit 204 may compare the potential levels of the second reference voltage VREF2 and the feedback voltage VFEED during the period between the first time point and the second time point, and even after the second time point. Then, the voltage generation circuit 308 may then determine the potential level of the internal voltage VCCI depending on a result of the comparison. In one embodiment, the operation of determining the potential level of the internal voltage VCCI in this way may be performed up to a time point (E), at which the potential levels of the second reference voltage VREF2 and the feedback voltage VFEED become equal to each other, e.g., the third time point.

For example, the level of the internal voltage VCCI may be determined to correspond to a level variation of the feedback voltage VFEED, having a relatively low potential level between the second reference voltage VREF2 and the feedback voltage VFEED, from the first time point to the third time point. For example, from the first time point to the second time point, in correspondence with the rise in the potential level of the feedback voltage VFEED in a stepwise manner through a plurality of periods, the potential level of the internal voltage VCCI may also rise in a stepwise manner through a plurality of periods.

Also, from the second time point to the third time point, in correspondence with the rise in potential level of the feedback voltage VFEED with a constant slope, the potential level of the internal voltage VCCI may also rise with a constant slope.

After the third time point (e.g., after the time point (E) at which the potential levels of the second reference voltage VREF2 and the feedback voltage VFEED become equal to each other), the potential level of the internal voltage VCCI may be determined depending on the potential level of the second reference voltage VREF2. For example, after the third time point, the potential level of the internal voltage VCCI may be stably maintained in correspondence to the second reference voltage VREF2, which maintains a stable potential level even with variations in PVT.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Although various embodiments have been described for illustrative purposes, it will be apparent to those skilled in the art that various changes and modifications may be made without departing from the spirit and scope of the disclosure as defined in the following claims. For instance, positions and kinds of the logic gates and transistors described as an example in the above embodiment should be differently realized according to the polarities of the signals inputted thereto. The embodiments may be combined to form additional embodiments.

What is claimed is:

1. An internal voltage generator, comprising:
a first voltage generator configured to generate a first initial voltage by buffering a first reference voltage input from a first time point to a second time point and to generate the first initial voltage by integrating a difference between a predetermined reference voltage and the first reference voltage input after the second time point, wherein the first time point is after a power-up time point and the second time point is after the first time point;
a divider configured to output a second initial voltage by dividing a potential level of the first initial voltage at a first preset ratio from the first time point to the second time point, and to output the first initial voltage as the second initial voltage after the second time point;
a selector configured to select and output the second initial voltage or a second reference voltage based on a comparison of a potential level of a feedback voltage and a potential level of the second reference voltage; and
a second voltage generator configured to generate an internal voltage by receiving or blocking an external power voltage depending on a result of comparing potential levels of an output voltage of the selector and the feedback voltage, and to generate the feedback voltage by dividing the internal voltage at a second preset ratio.

2. The internal voltage generator according to claim 1, wherein the divider is coupled to an output terminal of the first voltage generator and outputs the second initial voltage by dividing a potential level of the first initial voltage at the first preset ratio that is changed to different division ratios in a predetermined order over a plurality of periods between the first time point and the second time point.

3. The internal voltage generator according to claim 2, further comprising an enable signal generator configured to:
generate first to third enable signals in response to a power-up reset signal,
activate the first enable signal at the first time point at which a potential level of the external power voltage rises over a preset level,
activate the second enable signal at the second time point later by a preset delay amount than the first enable signal, and
generate the third enable signal which maintains an activated state between the first time point and the second time point.

4. The internal voltage generator according to claim 3, wherein the first voltage generator is configured to:
buffer the first reference voltage in response to activation of the first enable signal, and
generate the first initial voltage having a potential level that rises with a constant slope by integrating a difference between the first reference voltage and the predetermined reference voltage in response to activation of the second enable signal.

5. The internal voltage generator according to claim 3, further comprising:
a control signal generator configured to generate, in response to the first and second enable signals, a plurality of control signals which are activated in the predetermined order in each of the plurality of periods.

6. The internal voltage generator according to claim 5, wherein the divider is configured to:
output the second initial voltage by dividing a potential level of the first initial voltage at the first preset ratio, the first preset ratio changing to different division ratios based on the plurality of control signals during an activation period of the third enable signal, and
output the first initial voltage as the second initial voltage during a deactivation period of the third enable signal.

7. The internal voltage generator according to claim 1, wherein the selector is configured to:
output the second initial voltage from the first time point to a third time point at which potential levels of the feedback voltage and the second reference voltage become equal to each other, and
output the second reference voltage after the third time point, which is later than the second time point.

8. The internal voltage generator according to claim 7, wherein the second initial voltage from the first time point to the third time point has a potential level lower than the second reference voltage.

9. The internal voltage generator according to claim 7, wherein the second voltage generator is configured to:
receive the second initial voltage from the selector from the first time point to the third time point, and
raise a potential level of the internal voltage based on a comparison of potential levels of the second initial voltage and the feedback voltage.

10. An internal voltage generator, comprising:
a first voltage generator configured to generate a first initial voltage by buffering a first reference voltage input from a first time point to a second time point and to generate the first initial voltage by integrating a difference between a predetermined reference voltage and the first reference voltage input after the second time point, wherein the first time point is after a power-up time point and the second time point is after the first time point;
an enable signal generator configured to generate first to third enable signals in response to a power-up reset signal, activate the first enable signal at the first time point at which a potential level of an external power voltage rises over a preset level, activate the second enable signal at the second time point later by a preset delay amount than the first enable signal, and generate the third enable signal which maintains an activated state between the first time point and the second time point;
a control signal generator configured to generate, in response to the first and second enable signals, a plurality of control signals activated in a predetermined order in each of a plurality of periods;
a divider configured to output a second initial voltage by dividing a potential level of the first initial voltage at a first preset ratio that is changed based on the plurality of control signals during an activation period of the third enable signal, and to output the first initial voltage as the second initial voltage during a deactivation period of the third enable signal; and
a second voltage generator configured to generate an internal voltage by receiving or blocking the external power voltage depending on a result of comparing potential levels of a feedback voltage and one of the second initial voltage and a second reference voltage, and to generate the feedback voltage by dividing the internal voltage at a second preset ratio.

11. A semiconductor device, comprising:
a power-up reset circuit configured to detect a potential level of an external power voltage, and to generate a power-up reset signal which transitions at a first time point at which a potential level of the external power voltage rises over a preset level;
a reference voltage generator configured to receive the external power voltage, and generate first and second reference voltages; and
an internal voltage generator configured to:
start to operate in response to the power-up reset signal,
output a second initial voltage by dividing, at a first preset ratio, a potential level of a first initial voltage that is generated by buffering the first reference voltage from the first time point to a second time point later than the first time point, output, after the second time point, the first initial voltage having a potential level that rises with a constant slope, as the second initial voltage by integrating a difference between the first reference voltage and a ground voltage,
generate an internal voltage by receiving or blocking the external power voltage depending on a result of comparing potential levels of a feedback voltage and one of the second initial voltage and the second reference voltage, and
generate the feedback voltage by dividing the internal voltage at a second preset ratio.

12. The semiconductor device according to claim 11, wherein the internal voltage generator comprises:
a first voltage generator configured to generate the first initial voltage by buffering the first reference voltage input from the first time point to the second time point, and to generate the first initial voltage having a potential level rises with the constant slope by integrating the difference between the first reference voltage input after the second time point and the predetermined reference voltage;
a divider configured to output the second initial voltage by dividing a potential level of the first initial voltage at the first preset ratio from the first time point to the second time point, and to output the first initial voltage as the second initial voltage after the second time point;
a selector configured to select and output the second initial voltage or the second reference voltage by comparing a potential level of the feedback voltage and a potential level of the second reference voltage; and
a second voltage generator configured to generate the internal voltage by receiving or blocking the external power voltage depending on a result of comparing potential levels of an output voltage of the selector and the feedback voltage, and to generate the feedback voltage by dividing the internal voltage at the second preset ratio.

13. The semiconductor device according to claim 12, wherein the divider is coupled to an output terminal of the first voltage generator and outputs the second initial voltage by dividing a potential level of the first initial voltage at the first preset ratio that is changed in a predetermined order over a plurality of periods between the first time point and the second time point.

14. The semiconductor device according to claim 13, further comprising an enable signal generator configured to:
generate first to third enable signals in response to the power-up reset signal,
activate the first enable signal at the first time point,
activate the second enable signal at the second time point later by a preset delay amount than the first enable signal, and
generate the third enable signal which maintains an activated state between the first time point and the second time point.

15. The semiconductor device according to claim 14, wherein the first voltage generator is configured to:
generate the first initial voltage by buffering the first reference voltage in response to activation of the first enable signal, and
generate the first initial voltage having a potential level rises with the constant slope, by integrating a difference between the first reference voltage and the predetermined reference voltage in response to activation of the second enable signal.

16. The semiconductor device according to claim 14, further comprising:
a control signal generator configured to generate, in response to the first and second enable signals, a plurality of control signals which are activated in the predetermined order in each of the plurality of periods.

17. The semiconductor device according to claim 16, wherein the divider is configured to:
outputs the second initial voltage by dividing a potential level of the first initial voltage at the first preset ratio that is changed based on the plurality of control signals during an activation period of the third enable signal, and
output the first initial voltage as the second initial voltage during a deactivation period of the third enable signal.

18. The semiconductor device according to claim 12, wherein the selector is configured to:
output the second initial voltage from the first time point to a third time point at which potential levels of the feedback voltage and the second reference voltage become equal to each other, the third time point being later than the second time point, and
output the second reference voltage after the third time point.

19. The semiconductor device according to claim 18, wherein the second initial voltage from the first time point to the third time point has a potential level lower than the second reference voltage.

20. The semiconductor device according to claim 18, wherein the second voltage generator is configured to:
receive the second initial voltage from the selector from the first time point to the third time point, and
raise a potential level of the internal voltage based on a comparison of potential levels of the second initial voltage and the feedback voltage.

* * * * *